(12) United States Patent
Lee et al.

(10) Patent No.: US 12,094,865 B2
(45) Date of Patent: Sep. 17, 2024

(54) DISPLAY DEVICE AND METHOD OF FABRICATING THE SAME

(71) Applicant: Samsung Display Co. Ltd., Yongin-si (KR)

(72) Inventors: Seung Chan Lee, Hwaseong-si (KR); Gun Hee Kim, Hwaseong-si (KR); Sang Ho Park, Hwaseong-si (KR); Ju Won Yoon, Suwon-si (KR); Joo Hee Jeon, Hwaseong-si (KR); Hyun Joon Kim, Hwaseong-si (KR)

(73) Assignee: SAMSUNG DISPLAY CO. LTD., Yongin-si (KR)

( * ) Notice: Subject to any disclaimer, the term of this patent is extended or adjusted under 35 U.S.C. 154(b) by 23 days.

(21) Appl. No.: 17/841,247

(22) Filed: Jun. 15, 2022

(65) Prior Publication Data

US 2022/0310579 A1 Sep. 29, 2022

Related U.S. Application Data

(62) Division of application No. 16/373,502, filed on Apr. 2, 2019, now Pat. No. 11,393,804.

(30) Foreign Application Priority Data

Aug. 9, 2018 (KR) ........................ 10-2018-0093135

(51) Int. Cl.
*H01L 25/18* (2023.01)
*H01L 25/00* (2006.01)
(Continued)

(52) U.S. Cl.
CPC .............. *H01L 25/18* (2013.01); *H01L 25/50* (2013.01); *H10K 59/131* (2023.02); *H10K 59/18* (2023.02); *H10K 77/10* (2023.02)

(58) Field of Classification Search
CPC ..... H01L 25/0753; H01L 25/50; H01L 25/18; H01L 25/167; H01L 51/0096;
(Continued)

(56) References Cited

U.S. PATENT DOCUMENTS 9,970,628 B2 5/2018 Zhang
10,062,675 B2 8/2018 Chang et al.
(Continued)

FOREIGN PATENT DOCUMENTS

JP 2007-227739 9/2007
JP 2015-175969 10/2015
(Continued)

*Primary Examiner* — Vongsavanh Sengdara
(74) *Attorney, Agent, or Firm* — KILE PARK REED & HOUTTEMAN PLLC

(57) ABSTRACT

A display device and a method for fabricating the same. The display device includes a substrate including a circuit layer and a first pad unit; an auxiliary substrate disposed below the substrate and comprising a driving circuit and a second pad unit; a light-emitting unit disposed on the circuit layer; and a connection electrode in contact with a side surface of the substrate and electrically connecting the first pad unit with the second pad unit. The method includes forming a circuit layer and a first pad unit on a first surface of a substrate; forming a driving circuit and a second pad unit on a fourth surface of an auxiliary substrate; and attaching a second surface of the substrate opposite the first surface to a third surface of the auxiliary substrate opposite the fourth surface.

11 Claims, 13 Drawing Sheets

(51) Int. Cl.
*H10K 59/131* (2023.01)
*H10K 59/18* (2023.01)
*H10K 77/10* (2023.01)

(58) Field of Classification Search
CPC . H01L 27/3293; H01L 27/3276; H10K 77/10; H10K 59/131; H10K 59/18
See application file for complete search history.

(56) References Cited

U.S. PATENT DOCUMENTS

| | | | |
|---|---|---|---|
| 2005/0140308 A1* | 6/2005 | Park | H10K 59/1213 |
| | | | 315/169.3 |
| 2014/0344544 A1* | 11/2014 | Nakamura | G11C 19/186 |
| | | | 711/167 |
| 2015/0116295 A1* | 4/2015 | Pyon | H10K 50/8426 |
| | | | 345/80 |
| 2015/0282293 A1 | 10/2015 | Lim et al. | |
| 2016/0088726 A1* | 3/2016 | Jeon | H05K 1/0281 |
| | | | 361/749 |
| 2016/0111600 A1* | 4/2016 | Chae | H01L 33/38 |
| | | | 257/99 |
| 2018/0019233 A1* | 1/2018 | Chang | H01L 33/382 |
| 2018/0190631 A1 | 7/2018 | Kim et al. | |
| 2020/0388661 A1* | 12/2020 | Kishimoto | H10K 59/1213 |

FOREIGN PATENT DOCUMENTS

| | | |
|---|---|---|
| KR | 10-2018-0005279 | 1/2018 |
| KR | 10-2018-0009116 | 1/2018 |
| KR | 2018-0079079 | 7/2018 |

\* cited by examiner

DISPLAY DEVICE AND METHOD OF FABRICATING THE SAME

CROSS-REFERENCE TO RELATED APPLICATION(S)

This is a divisional application of U.S. patent application Ser. No. 16/373,502, filed Apr. 2, 2019, now U.S. Pat. No. 11,393,804 issued on Jul. 17, 2022, the disclosure of which is incorporated herein by reference in its entirety. U.S. patent application Ser. No. 16/373,502 claims priority to and benefit of Korean Patent Application No. 10-2018-0093135 under 35 U.S.C. § 119, filed on Aug. 9, 2018, in the Korean Intellectual Property Office, the entire contents of which are incorporated herein by reference.

BACKGROUND

Field

Exemplary embodiments of the invention relate to a display device and a method for fabricating the same.

Discussion of the Background

Light-emitting diodes (LEDs) are devices that convert electrical signals into light, such as infrared and visible light, using the characteristics of compound semiconductors. LEDs are used for home appliances, remote controllers, electric boards, and various automation devices. Recently, LEDs have been used in a wider range of applications, from small handheld electronic devices to large display devices. A tiled display device in which a plurality of light-emitting diode display devices are combined in a matrix form (so-called "tiled" form) is currently available in the market.

There is a region where a drive IC or other printed circuits are disposed on the outer periphery of the glass substrate of a display device. This region may be referred to as a bezel, which is a non-display area where no image is displayed.

Since a tiled display device is implemented by connecting a plurality of display devices, non-display areas are formed between the display devices in each of which the bezel of one of the display devices overlaps with the bezel of another one. Such non-display areas hinder viewers from being fully immersed into the displayed images.

The above information disclosed in this Background section is only for understanding of the background of the inventive concepts, and, therefore, it may contain information that does not constitute prior art.

SUMMARY

Exemplary embodiments of the present invention make it possible to prevent damage which may occur during the process of fabricating a display device, and to reduce the size of the bezel of the display device.

Additional features of the inventive concepts will be set forth in the description which follows, and in part will be apparent from the description, or may be learned by practice of the inventive concepts.

An exemplary embodiment of the present invention provides a display device including a circuit layer and a first pad unit disposed on a substrate; an auxiliary substrate disposed below the substrate; a driving circuit and a second pad unit disposed on the auxiliary substrate; a light-emitting unit disposed on the circuit layer; and a connection electrode in contact with a side surface of the substrate and electrically connecting the first pad unit with the second pad unit.

Another exemplary embodiment of the present invention provides a method of fabricating a display device including: forming a circuit layer and a first pad unit on a first surface of a substrate; forming a driving circuit and a second pad unit on a fourth surface of an auxiliary substrate; and attaching a second surface of the substrate opposite the first surface to a third surface of the auxiliary substrate opposite the fourth surface.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
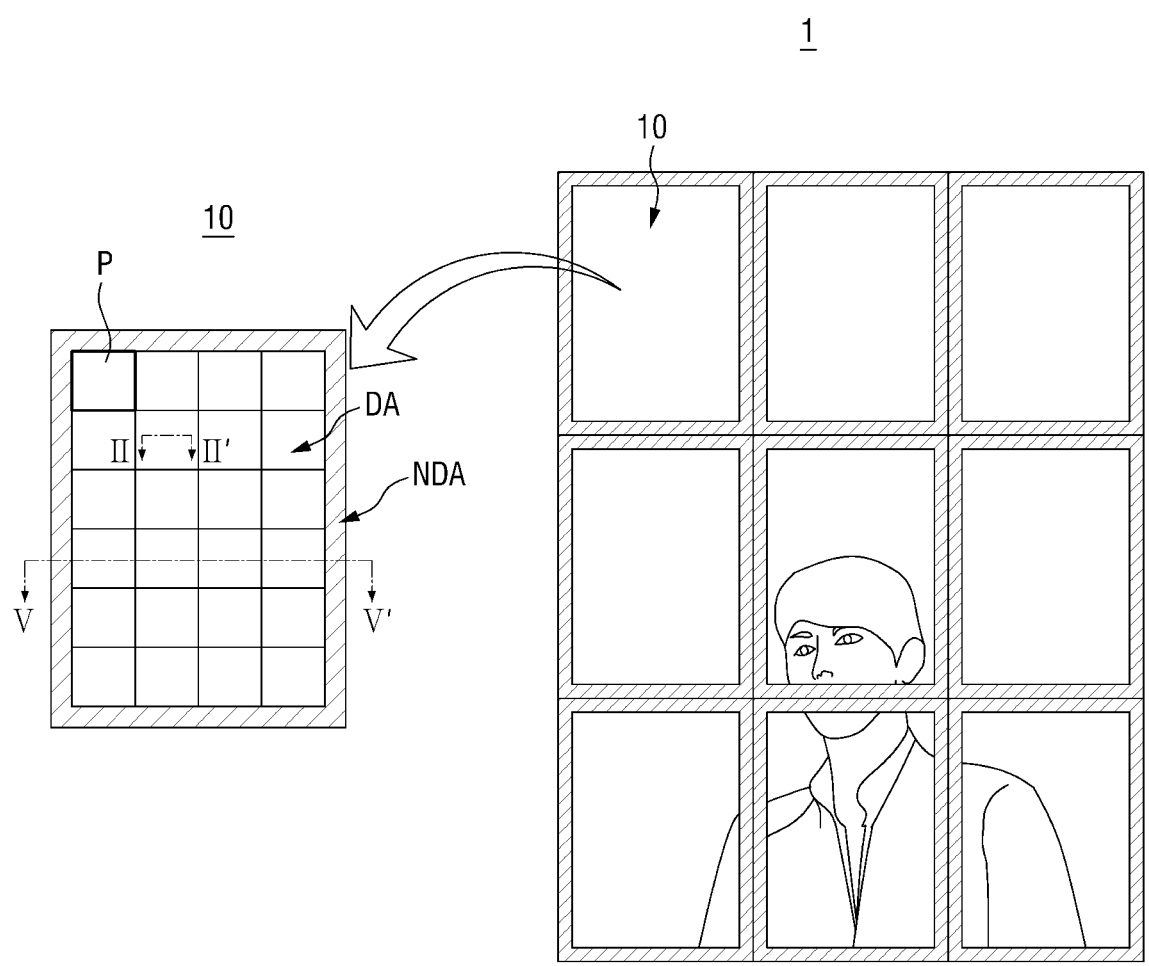
FIG. 1 is a plan view showing display devices according to an exemplary embodiment of the present invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present invention will be described with reference to the accompanying drawings. FIG. 1 is a plan view showing display devices according to an exemplary embodiment of the present invention.

Referring to FIG. 1, a tiled display device 1 may be implemented by connecting a plurality of display devices 10. Each of the display devices 10 may include a display area DA and a non-display area NDA surrounding the display area DA. In addition, the display area DA may include a plurality of pixels P. Each of the pixels may include, but is not limited to, a light-emitting diode or an organic light-emitting diode (OLED).

Figure 2:
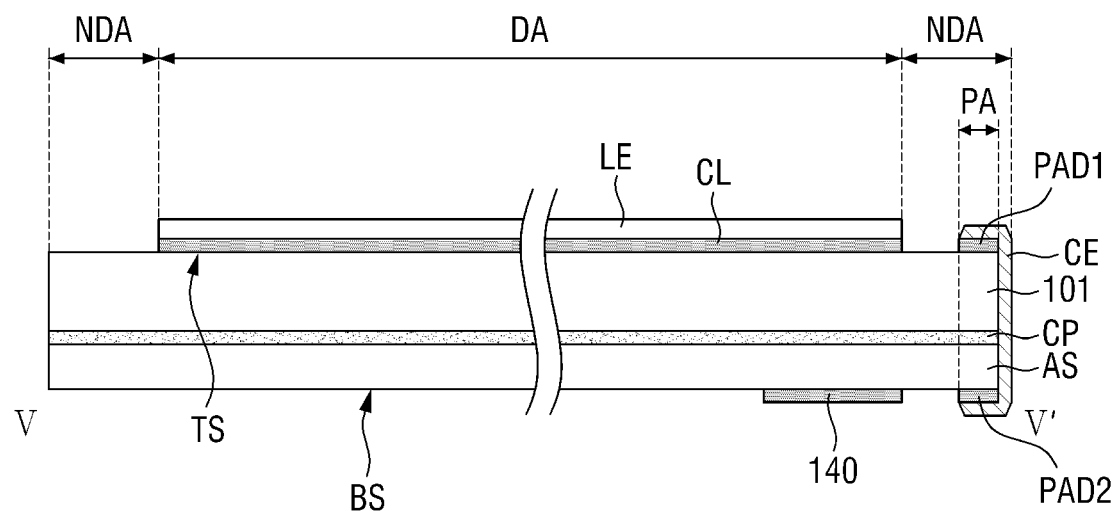
FIG. 2 is a cross-sectional view according to an exemplary embodiment of the present invention, taken along line V-V of FIG. 1.
Figure 3:
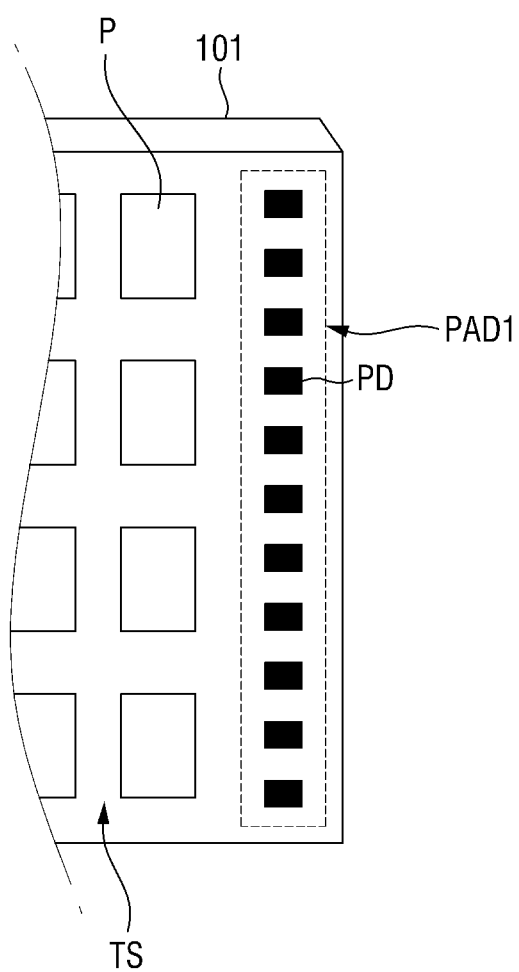
FIG. 3 is a view showing a first pad unit.
Figure 4:
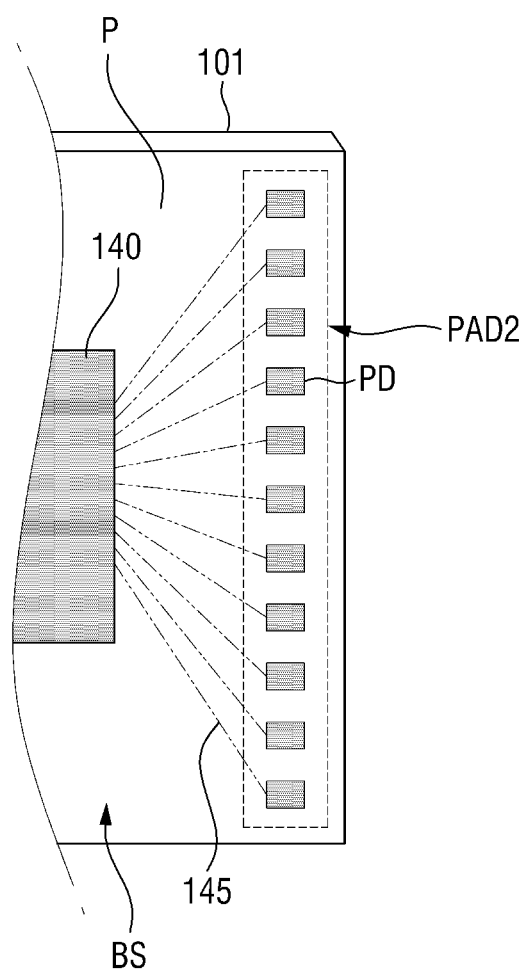
FIG. 4 is a view showing a second pad unit.

FIG. 2 is a cross-sectional view taken along line V-V of FIG. 1 according to an exemplary embodiment of the present invention. FIG. 3 is a view showing a first pad unit. FIG. 4 is a view showing a second pad unit.

Referring to FIGS. 2 to 4, a display area DA including a plurality of pixels P and a non-display area NDA surrounding the display area DA may be defined in the display device 10.

A circuit layer CL may be disposed on the substrate 101 of the display device 10 in the display area DA, and a light-emitting unit LE may be disposed on the circuit layer CL.

The circuit layer CL may include a plurality of signal lines and electronic elements disposed in the display device 10. For example, the circuit layer CL may include gate lines, data lines, and thin-film transistors TFT each in the respective pixels P, as shown in FIG. 6.

Figure 6:
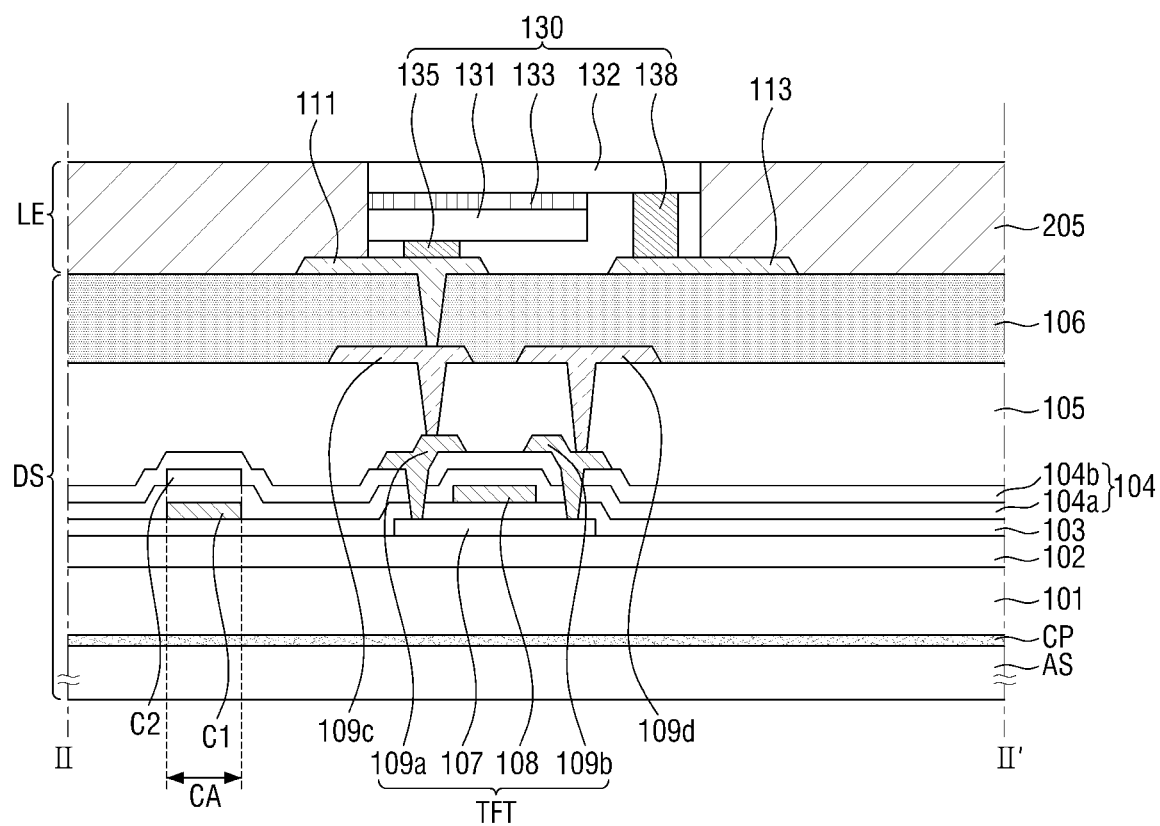
FIG. 6 is a cross-sectional view according to an exemplary embodiment of the present invention, taken along line II-II' of FIG. 1.
Figure 7:
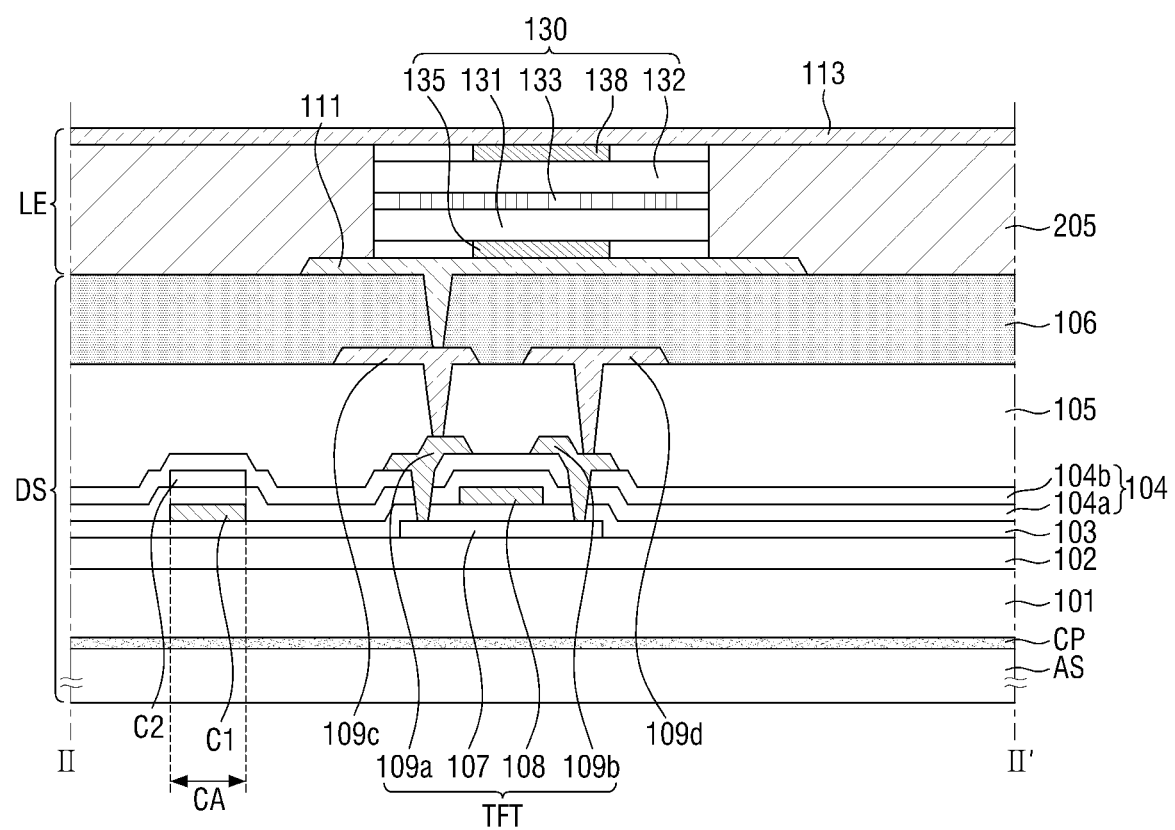
FIG. 7 is a cross-sectional view according to another exemplary embodiment of the present invention, taken along line II-II' of FIG. 1.
Figure 8:
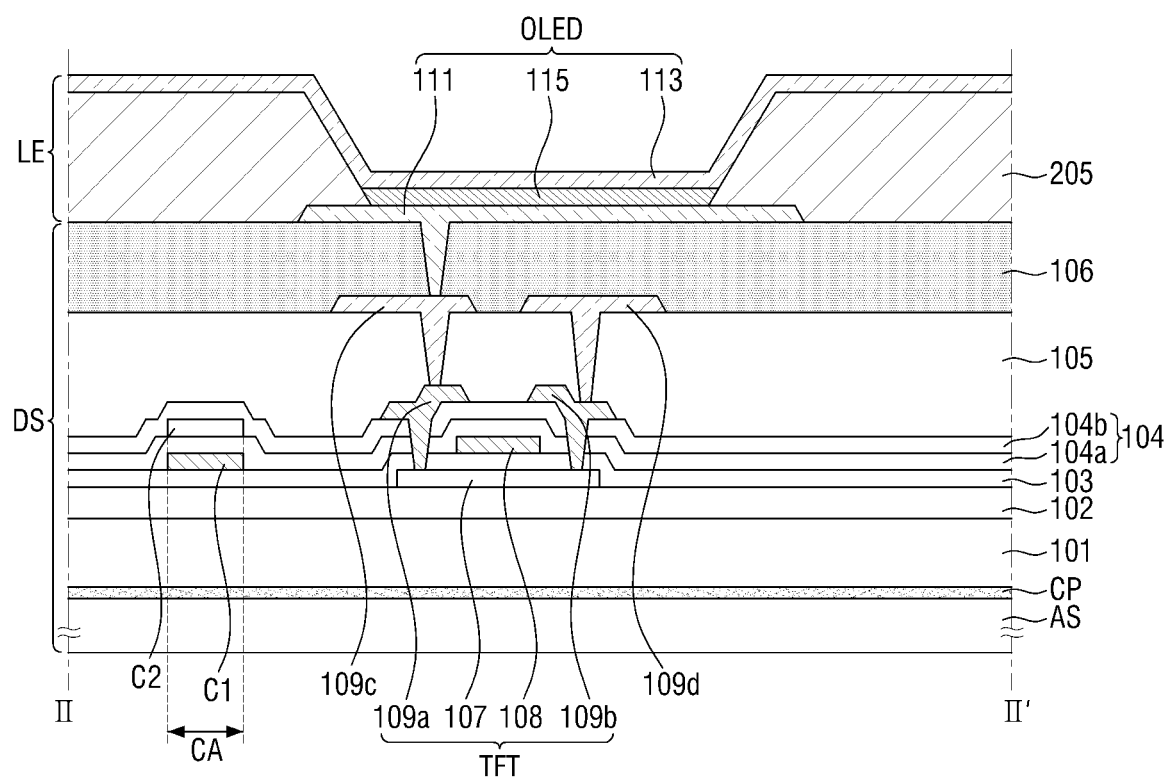
FIG. 8 is a cross-sectional view according to yet another exemplary embodiment of the present invention, taken along line II-II' of FIG. 1.

The light-emitting unit LE may be implemented as a light-emitting diode (LED) 130, as shown in FIGS. 6 and 7, or an organic light-emitting diode (OLED), as shown in FIG. 8. When the light-emitting unit LE is implemented as an organic light-emitting diode, an encapsulation layer may be further disposed on the light-emitting unit LE to block the permeation of air and moisture into the organic emissive layer. It is, however, to be understood that the inventive concepts are not limited thereto.

A pad area PA is located on one side of the non-display area NDA of the display device 10. The first pad unit PAD1 is disposed on the top surface TS of the substrate 101 in the pad area PA.

A plurality of pads PD of the first pad unit PAD1 and a plurality of pixels P of FIG. 1 are electrically connected through a plurality of signal lines 145.

An auxiliary substrate AS may be disposed below the substrate 101 of the display device 10. The auxiliary substrate AS may be made of, but is not limited to, a glass material. For example, it may be made of a transparent plastic material, such as polyimide. The side surfaces of the substrate 101 may be aligned with the side surfaces of the auxiliary substrate AS, respectively, in a direction perpendicular to the direction in which the substrate is extended. It is, however, to be understood that this is merely illustrative.

When the auxiliary substrate AS is made of a glass material, the substrate 101 may be made of a glass material, as well. It is, however, to be understood that this is merely illustrative.

The auxiliary substrate AS may include a driving circuit 140. The driving circuit 140 may include a gate driver, a gate drive IC, a data driver, and a data drive IC.

The gate driver generates gate signals in response to a gate control signal applied from a timing controller, and sequentially supplies the gate signals to the plurality of gate lines. The gate driver may be implemented as, for example, a shift register which shifts a gate start pulse according to a gate shift clock to generate gate signals. The shift register may include a plurality of switching elements.

The data drive ICs receive digital image data signals and data control signals from the timing controller. The data drive ICs sample the digital image data signals according to the data control signals, latch the sampled image data signals line-by-line every horizontal period, and supply the latched image data signals to the data lines. That is to say, the data drive ICs convert the digital image data signals from the timing controller into analog image signals using the gamma voltage supplied from a power supply, and supply them to the data lines.

The driving circuit 140 may be implemented in the form of an integrated circuit chip and directly mounted on the back surface of the auxiliary substrate AS or attached to the back surface of the auxiliary substrate AS in the form of a chip-on-film, for example.

The opposite surface of the auxiliary substrate AS may be attached to the back surface of the substrate 101 via an adhesive member CP. The adhesive member CP may be made of, but is not limited to, an optically clear adhesive film (OCA), an optically clear resin (OCR), or a pressure sensitive adhesive film (PSA). For example, the substrate 101 may include a first surface and a second surface opposite to the first surface. The first surface may be the top surface TS of the substrate 101 on which the circuit layer CL and the first pad unit PAD1 are disposed, and the second surface may be the back surface opposite to the top surface TS. The auxiliary substrate AS may include a third surface and a fourth surface. The fourth surface may be the back surface BS of the auxiliary substrate AS on which the driving circuit 140 is disposed, and the third surface may be the top surface of the auxiliary substrate AS disposed between the fourth surface and the second surface. The second surface of the substrate 101 may be attached and fixed to the third surface of the auxiliary substrate AS via the adhesive member CP. The second pad unit PAD2 is disposed on the back surface BS of the auxiliary substrate AS in the pad area PA of the display device 10. The first pad unit PAD1 of the substrate 101 may overlap with the second pad unit PAD2 of the auxiliary substrate AS in the vertical direction. In other words, the first pad unit PAD1 and the second pad unit PAD2 of the auxiliary substrate AS may be aligned so that they overlap with each other when viewed from the top. It is, however, to be understood that this is merely illustrative.

The pads PD of the second pad unit PAD2 are electrically connected to the driving circuit 140 via a plurality of the signal lines 145.

The pads PD of the first pad unit PAD1 of the substrate 101 may be electrically connected to the pads PD of the second pad unit PAD2 of the auxiliary substrate AS by connection electrodes CE. For example, the connection electrodes CE may be disposed such that they cover the first pad unit PAD1, the side surfaces of the substrate 101 and the auxiliary substrate AS, and the second pad unit PAD2.

The plurality of pads PD of the first pad unit PAD1 may be, but is not limited to being, connected to the plurality of pads PD of the second pad unit PAD2. The pads PD of the first pad unit PAD1 may be connected to one of the pads PD of the second pad unit PAD2 via the connection electrodes CE or one of the pads PD of the first pad unit PAD1 may be connected to the pads PD of the second pad unit PAD2 via the connection electrodes CE.

The connection electrodes CE may be made of, but is not limited to, silver (Ag). For example, the connection electrodes may be made of a silver-based metal such as a silver alloy, or a copper-based metal such as copper (Cu) or a copper alloy.

The first pad unit PAD1 may be electrically connected to the second pad unit PAD2 via the connection electrodes CE, so that the first pad unit PAD1 can receive signals for driving the display device 10 from the driving circuit 140. In addition, by connecting the first pad unit PAD1 with the second pad unit PAD2 through the connection electrode CE without flexible printed circuit boards, it is possible to effectively reduce the size of the non-display areas NDA of the tiled display device 1 in each of which the bezel of one of the display devices 10 and the bezel of the adjacent one are disposed (see FIG. 1).

Further, the driving circuit 140 and the second pad unit PAD2 are formed on the separate auxiliary substrate AS, and the auxiliary substrate AS is attached to the back surface of the substrate 101 on which the circuit layer CL is formed. By doing so, it is possible to effectively prevent the circuit layer CL from being damaged during the existing process of forming the circuit layer CL on the substrate 101 and then forming the driving circuit 140 and the second pad unit PAD2 on the back surface of the substrate 101.

Figure 14:
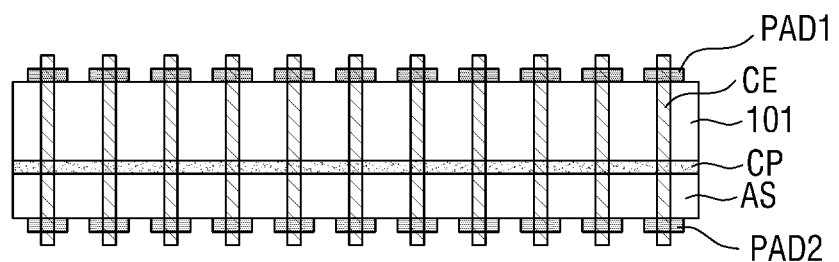
FIG. 14 is a lateral view for illustrating the first pad unit and the second pad unit connected by the connection electrodes.

FIG. 14 is a lateral view for illustrating the first pad unit PAD1 and the second pad unit PAD2 connected by the connection electrodes CE. Referring to FIG. 14, the pads PD included in the first pad unit PAD1 may be connected to the pads PD included in the second pad unit PAD2 through the connection electrodes CE, respectively. In other words, the connection electrode CE connects the pads PD included in the first pad unit PAD1 with the pads PD included in the second pad unit PAD2, respectively. Although not shown in the drawings, the connection electrodes CE may be covered by a protective layer made of an organic material or an inorganic material.

Figure 15:
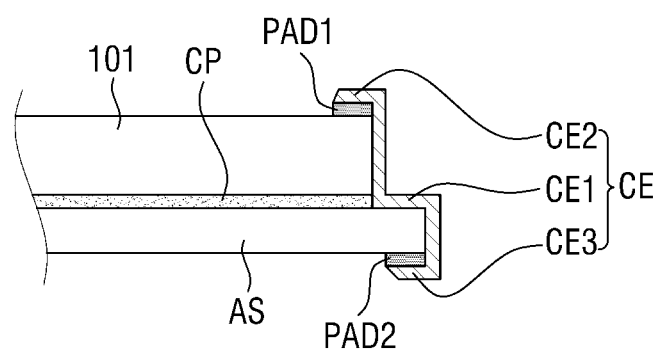
FIG. 15, FIG. 16, FIG. 17, and FIG. 18 are cross-sectional views for illustrating examples of the connection electrodes connecting the first pad unit with the second pad unit.

FIGS. 15 to 18 are cross-sectional views for illustrating examples of the connection electrodes CE connecting the first pad unit PAD1 with the second pad unit PAD2. Referring to FIG. 15, according to an exemplary embodiment of the present invention, the side surfaces of the substrate 101 may not be aligned with the side surfaces of the auxiliary substrate AS in a direction perpendicular to the direction in which the substrate 101 is extended. That is to say, the side surface of the auxiliary substrate AS may protrude outward from the side surface of the substrate 101. Although not shown in the drawings, the side surface of the substrate 101 may protrude outward from the side surface of the auxiliary substrate AS.

Each of the connection electrodes CE may include a first portion CE1 in contact with the side surfaces of the substrate 101 and the auxiliary substrate AS, a second portion CE2 in contact with the first pad unit PAD1, and a third portion CE3 in contact with the second pad unit PAD2. When the side surface of the auxiliary substrate AS protrudes from the side surface of the substrate 101 in a direction perpendicular to the extending direction of the substrate 101, the first portion CE1 of the connection electrode CE may be in contact with the top surface of the auxiliary substrate AS.

Figure 16:
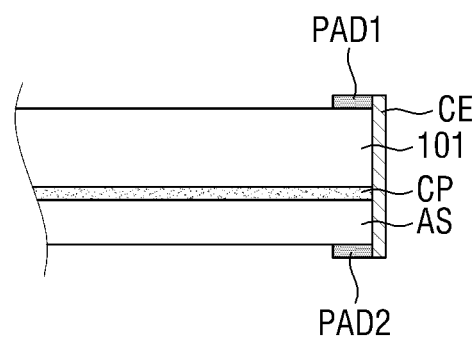

Referring to FIG. 16, the connection electrode CE may be in contact with the side surface of the substrate 101 and the side surfaces of the first pad unit PAD1 and the second pad unit PAD2. In other words, the connection electrode CE may have a bar shape that connects the side surface of the first pad unit PAD1 with the side surface of the second pad unit PAD2.

Figure 17:
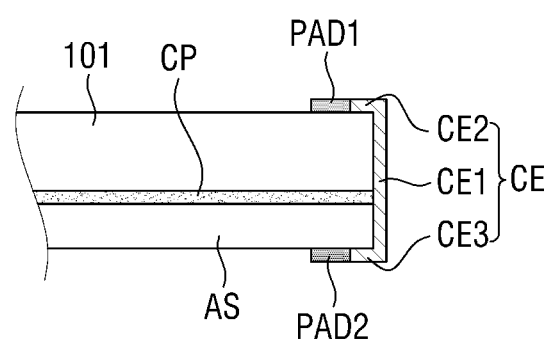

Referring to FIG. 17, when the first pad unit PAD1 and the second pad unit PAD2 are not aligned with the side surfaces of the substrate 101 and the auxiliary substrate AS but are disposed more to the inside, the connection electrodes CE may include a first portion CE1 in contact with the side surface of the substrate 101 and the side surface of the auxiliary substrate AS, a second portion CE2 in contact with the side surface of the first pad unit PAD1, and a third portion CE3 in contact with the side surface of the second pad unit PAD2. Specifically, the second portion CE2 and the third portion CE3 of the connection electrode CE may be bent from the first portion CE1 at the right angle to be in contact with the side surfaces of the first pad unit PAD1 and the second pad unit PAD2.

Figure 18:
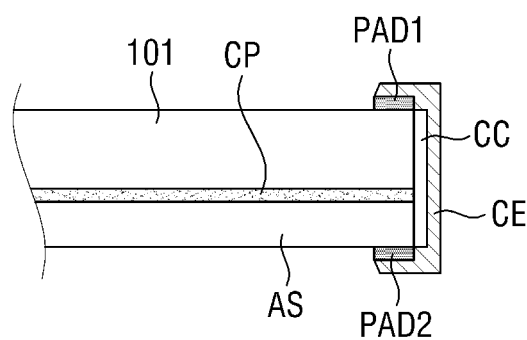

Referring to FIG. 18, an adhesive member CC may be disposed between the connection electrode CE and the side surfaces of the substrate 101 and the auxiliary substrate AS. The adhesion member CC may improve adhesion between the connection electrode CE and the side surfaces of the substrate 101 and the auxiliary substrate AS. For example, the adhesive member CC may be made of, but is not limited to, an organic layer, an inorganic layer, and a primer layer.

Figure 5:
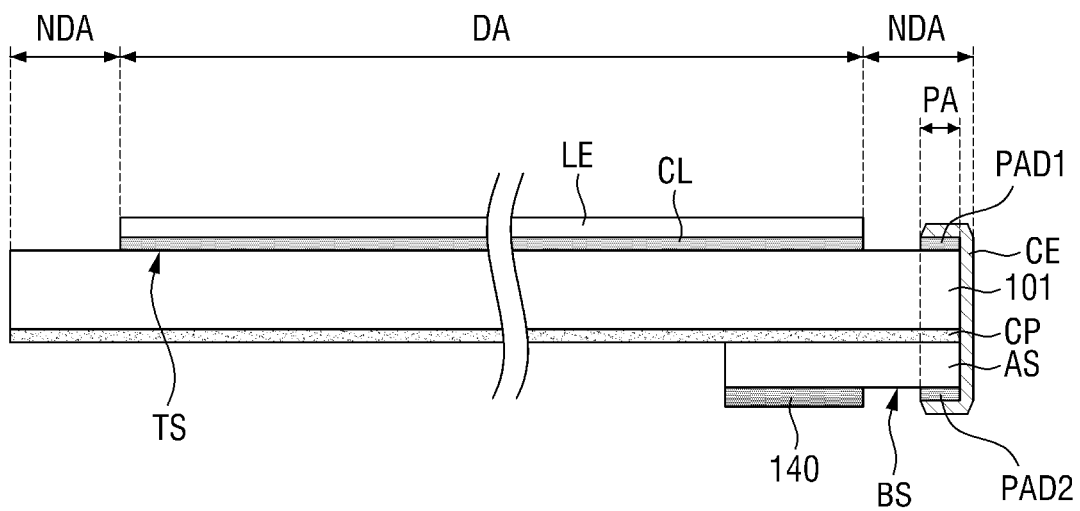
FIG. 5 is a cross-sectional view according to according to another exemplary embodiment of the present invention, taken along line V-V of FIG. 1.

FIG. 5 is a cross-sectional view according to another exemplary embodiment of the present invention, taken along line V-V in FIG. 1.

In the following description, the same or similar elements will be denoted by the same or similar reference numerals, and redundant descriptions will be omitted or briefly described. Descriptions will be made focusing on differences from the above exemplary embodiments.

Referring to FIG. 5, the auxiliary substrate AS including the driving circuit 140 may be smaller than the substrate. For example, the auxiliary substrate AS may be extended from the non-display area NDA to a part of the display area DA. Since the auxiliary substrate AS is smaller than the substrate, the display device 10 can become lighter, and the auxiliary substrate AS can be aligned with the side surface of the substrate, so that the fabricating process can be easier.

FIG. 6 is a cross-sectional view according to an exemplary embodiment of the present invention, taken along line II-II' of FIG. 1. FIG. 7 is a cross-sectional view according to another exemplary embodiment of the present invention, taken along line II-II' of FIG. 1. FIG. 8 is a cross-sectional view according to yet another exemplary embodiment of the present invention, taken along line II-II' of FIG. 1.

The display device 10 of FIG. 1 according to an exemplary embodiment of the present invention may include a substrate part DS and a light-emitting unit LE on the substrate part DS.

The substrate part DS may include a substrate 101 and an auxiliary substrate AS under the substrate 101.

The auxiliary substrate AS may include the driving circuit. The driving circuit may include a gate driver for applying a gate signal to a gate line connected to a pixel P (see FIG. 1), and a data driver for applying a data signal to a data line. The driving circuit may be formed as an integrated circuit chip and mounted directly on the back surface of the auxiliary substrate AS or may be attached to the substrate 101 in the form of a chip-on-film (COF).

A thin-film transistor TFT, a planarization layer 105 over the thin-film transistor TFT, first and second connection patterns 109c and 109d disposed on the planarization layer 105 and connected to the thin-film transistor TFT through via holes, a passivation layer 106 on the first and second connection patterns 109c and 109d, and a first electrode 111 disposed on the passivation layer 106 and connected to one of the first and second connection patterns 109c and 109d through a via hole may be disposed on the substrate 101.

The substrate 101 may include various materials. For example, the substrate 101 may be made of a transparent glass material composed mainly of $SiO_2$. It is, however, to be understood that the inventive concepts are not limited thereto. The substrate 101 may be made of a transparent plastic material and may have flexibility.

The plastic material may be an insulating organic material. It may be an organic material selected from the group consisting of: polyethersulphone (PES), polyacrylate (PAR), polyetherimide (PEI), polyethyelenen naphthalate (PEN), polyethyeleneterepthalate (PET), polyphenylene sulfide (PPS), polyallylate, polyimide, polycarbonate (PC), cellulose triacetate (TAC), and cellulose acetate propionate (CAP).

A buffer layer 102 may be formed on the substrate 101. The buffer layer 102 may provide a flat surface on the substrate 101 and may block foreign matter or moisture from permeating through the substrate 101. For example, the buffer layer 102 may contain an inorganic material, such as silicon oxide, silicon nitride, silicon oxynitride, aluminum oxide, aluminum nitride, titanium oxide, or titanium nitride, or an organic material, such as polyimide, polyester, or acryl. Alternatively, the buffer layer 102 may be a stack of the above-listed materials.

The thin-film transistor TFT may include an active layer 107, a gate electrode 108, a first source/drain electrode 109a, and a second source/drain electrode 109b.

In the following description, the thin-film transistor TFT is of a top-gate thin-film transistor in which an active layer 107, a gate electrode 108, a first source/drain electrode 109a, and a second source/drain electrode 109b are sequentially formed. It is, however, to be understood that the inventive concepts are not limited thereto. Any of a variety of types of thin-film transistors TFT, such as a bottom-gate thin-film transistor, may be employed as well.

The active layer 107 may include a semiconductor material, such as amorphous silicon or polycrystalline silicon. It is, however, to be understood that the inventive concepts are not limited thereto. The active layer 107 may contain various materials. As an exemplary embodiment, the active layer 107 may contain an organic semiconductor material or the like.

As another alternative embodiment, the active layer 107 may contain an oxide semiconductor material. For example, the active layer 107 may include a Group XII, XIII, or XIV metal element, such as zinc (Zn), indium (In), gallium (Ga), tin (Sn), cadmium (Cd), and germanium (Ge), or an oxide of the material selected from a combination thereof.

A gate insulating layer 103 is disposed over the active layer 107. The gate insulating layer 103 serves to insulate the active layer 107 from the gate electrode 108. The gate insulating layer 103 may be made up of a single layer of an inorganic material, such as silicon oxide or silicon nitride, or multiple layers thereof.

A gate electrode 108 is disposed on the gate insulating layer 103 above the active layer 107. The gate electrode 108 may be connected to a gate line (not shown) which applies on/off signals to the thin-film transistor TFT. A first capacitor electrode C1 is disposed on a part of the gate insulating layer 103 that lies in a capacitor area CA.

The gate electrode 108 and the first capacitor electrode C1 may be made of a metal material having low resistance. The gate electrode 108 and the first capacitor electrode C1 may be made up of a single layer of one selected from the group consisting of: molybdenum (Mo), tungsten (W), aluminum neodymium (AlNd), titanium (Ti), aluminum (Al), silver (Ag), and an alloy thereof or a mixture thereof. Alternatively, they may be made up of double layers or multiple layers of Mo, Al, or Ag, which is a low-resistance material, in order to reduce the line resistance. That is to say, multiple conductive layers may be sequentially stacked on one another in order to reduce the line resistance. Specifically, multiple layers of Mo/Al/Mo, MoW/AlNd/MoW, Mo/Ag/Mo, Mo/Al alloy/Mo, or Ti/Al/Mo may be employed.

A first interlayer dielectric layer 104a is disposed on the gate electrode 108 and the first capacitor electrode C1. A second capacitor electrode C2 is disposed on a part of the first interlayer dielectric layer 104a that lies in the capacitor area CA. The first interlayer dielectric layer 104a may be disposed between the second capacitor electrode 142 and the first capacitor electrode 141 to serve as a dielectric layer.

The first and second interlayer dielectric layers 104a and 104b insulate the first source/drain electrode 109a and the second source/drain electrode 109b from the gate electrode 108. The first and second interlayer dielectric layers 104a and 104b may be made of an inorganic material. For example, the inorganic material may be a metal oxide or a metal nitride. Specifically, the inorganic material may include, but is not limited to, silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZrO_2$).

The first source/drain electrode 109a and a second source/drain electrode 109b, which are spaced apart from each other, are disposed on the first and second interlayer dielectric layers 104a and 104b above the active layer 107. The first source/drain electrode 109a and the second source/drain electrode 109b may be made up of a single layer of at least one material selected from the group consisting of: aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), or multiple layers thereof. For example, the first source/drain electrode 109a and the second source/drain electrode 109b may have a stack structure of Ti/Al/Ti, Mo/Al/Mo, MoW/AlNd/MoW, Mo/Ag/Mo, Mo/Al alloy/Mo, or Ti/Al/Mo, etc.

Each of the first and second interlayer dielectric layers 104a and 104b include via holes for exposing the active layer 107. The first source/drain electrode 109a and the second source/drain electrodes 109b may come in contact with the active layer 107 through the via holes, respectively.

The planarization layer 105 is disposed over the first source/drain electrode 109a and the second source/drain electrode 109b throughout the entire surface of the substrate 101. The planarization layer 105 eliminates the level differences created by the thin-film transistor TFT and the first and second capacitor electrodes C1 and C2 to provide a flat upper surface. As a result, it is possible to prevent defects in the light-emitting unit LE produced by the level differences therebelow.

The planarization layer 105 may be made up of a single layer of an organic material or multiple layers thereof. Examples of the organic material may include a general polymer, such as polymethylmethacrylate (PMMA) and polystyrene (PS), a polymer derivative having a phenolic group, an acrylic polymer, an imide polymer, an aryl ether polymer, an amide polymer, a fluorine polymer, a p-xylene polymer, a vinyl alcohol polymer, and blends thereof. In addition, the planarization layer 105 may also be formed of a composite stack of an inorganic insulating layer and an organic insulating layer.

The first and second connection patterns 109c and 109d may be disposed on the planarization layer 105. The first and second connection patterns 109c and 109d may be connected to the first source/drain electrode 109a and the second source/drain electrode 109b through via holes, respectively, and may be made of the same material as that of the first source/drain electrode 109a and the second source/drain electrode 109b.

The passivation layer 106 may be disposed on the first and second connection patterns 109c and 109d. Examples of the passivation layer 106 may be made of, but is not limited to, an organic layer including a general polymer such as polymethylmethacrylate (PMMA) and polystyrene (PS), a polymer derivative having a phenolic group, an acrylic polymer, an imide polymer, an aryl ether polymer, an amide polymer, a fluorine polymer, a p-xylene polymer, a vinyl alcohol polymer, and blends thereof.

The first and second electrodes 111 and 113 and the light-emitting unit LE may be positioned on the passivation layer 106. The second electrode 113 in contact with a second electrode pad 138 may be formed on the passivation layer 106 like the first electrode 111. The second electrode 113 may be formed in the same layer as the first electrode 111 and spaced apart from the first electrode 111. As another example, an insulating layer may be interposed between the second electrode 113 and the first electrode 111, and an opening may be formed in the insulating layer to expose the first electrode 111 or the second electrode 113.

The first electrode 111 may be electrically connected to the thin-film transistor TFT. Specifically, the first electrode 111 may be connected to the first connection pattern 109c or the second connection pattern 109d through a contact hole formed in the passivation layer 106. Accordingly, the first electrode 111 may be electrically connected to the first source/drain electrode 109a or the second source/drain electrode 109b. For example, the first source/drain electrode 109a may be electrically connected to the first connection pattern 109c, and the first connection pattern 109c may be electrically connected to the first electrode 111. It is, however, to be understood that the inventive concepts are not limited thereto.

In addition, the first and second connection patterns 109c and 109d may be eliminated and the first electrode 111 may be directly connected to the first source/drain electrode 109a or the second source/drain electrode 109b. The first electrode 111 may have various shapes. For example, the first electrode 111 may be patterned in an island shape.

The light-emitting unit LE may include a light-emitting diode 130 electrically connected to the thin-film transistor TFT and a pixel-defining layer 205 surrounding the light-emitting diode 130.

The light-emitting diode 130 may emit red, green, or blue light, and may emit white light by using a fluorescent material or by combining colors. The light-emitting diode 130 may include a first semiconductor layer 131, a second semiconductor layer 132, and an intermediate layer 133 between the first semiconductor layer 131 and the second semiconductor layer 132.

The first semiconductor layer 131 may be implemented as, for example, a p-type semiconductor layer. The p-type semiconductor layer may be selected from semiconductor materials having a composition formula of $In_xAl_yGa_{(1-x-y)}N$, where $0 \le x \le 1$, $0 \le y \le 1$, and $0 \le x+y \le 1$, for example, GaN, AlN, AlGaN, InGaN, InN InAlGaN, AlInN, etc., and may be doped with a p-type dopant, such as Mg, Zn, Ca, Sr, or Ba.

The second semiconductor layer 132 may include an n-type semiconductor layer, for example. The n-type semiconductor layer may be selected from semiconductor materials having a composition formula of $In_xAl_yGa_{(1-x-y)}N$, where $0 \le x \le 1$, $0 \le y \le 1$, and $0 \le x+y \le 1$, for example, GaN, AlN, AlGaN, InGaN, InN InAlGaN, AlInN, etc., and may be doped with an n-type dopant such as Si, Ge and Sn.

It is, however, to be understood that the inventive concepts are not limited thereto. The first semiconductor layer 131 may include an n-type semiconductor layer, and the second semiconductor layer 132 may include a p-type semiconductor layer.

The intermediate layer 133 is a region where electrons and holes are recombined. As the electrons and the holes are recombined, they transit to a lower energy level and can generate light having a wavelength corresponding to the energy difference. The intermediate layer 133 may be formed of, for example, a semiconductor material having a composition formula of $In_xAl_yGa_{(1-x-y)}N$, where $0 \le x \le 1$, $0 \le y \le 1$, $0 \le x+y \le 1$. The intermediate layer 133 may be formed of a single-quantum-well structure or multiple-quantum-well (MQW) structure. The intermediate layer 133 may include a quantum-wire structure or a quantum-dot structure.

The pixel-defining layer 205 may be formed of a stretchable material and may come in contact with the side surfaces of the light-emitting diode 130 to prevent the light-emitting diode 130 from being dislocated. The pixel-defining layer 205 may be formed of, for example, an elastomeric silicone, an elastomeric polyurethane, an elastomeric polyisoprene, etc. Light-absorbing particles, such as carbon black, may be dispersed in the pixel-defining layer 205.

The pixel-defining layer 205 may serve as a light-blocking portion to block the light emitted from the side surface of the light-emitting diode 130, thereby preventing color mixing of lights generated in adjacent light-emitting diodes 130. In addition, the pixel-defining layer 205 may absorb and block the light incident from the outside, thereby improving the bright-room contrast ratio of the display device 10.

A first electrode pad 135 may be formed on the first semiconductor layer 131, and a second electrode pad 138 may be formed on the second semiconductor layer 132. The first electrode pad 135 may be attached to the first electrode 111, and the second electrode pad 138 may be attached to the second electrode 113. The first electrode pad 135 and the second electrode pad 138 may be orientated to face the same direction.

To this end, the first semiconductor layer 131 and the intermediate layer 133 are partially removed so that a part of the second semiconductor layer 132 is exposed, and the second electrode pad 138 may be formed on the exposed part of the second semiconductor layer 132. That is to say, the area of the second semiconductor layer 132 may be greater than the areas of the first semiconductor layer 131 and the intermediate layer 133, and the second electrode pad 138 may be disposed on the part of the second semiconductor layer 132 that protrudes outward from the first semiconductor layer 131 and the intermediate layer 133.

The first electrode 111 and the second electrode 113 may include a reflective layer formed of Ag, Mg, Al, Pt, Pd, Au, Ni, Nd, Ir, Cr and a compound thereof, and a transparent or transflective electrode layer formed on the reflective layer. The transparent or transflective electrode layer may include at least one selected from the group consisting of: indium tin oxide (ITO), indium zinc oxide (IZO), zinc oxide (ZnO), indium oxide ($In_2O_3$), indium gallium oxide (IGO), and aluminum zinc oxide (AZO). It is, however, to be understood that this is merely illustrative.

The second electrode 113 may be a transparent or transflective electrode, and may be formed as thin metal film having a small work function, including Li, Ca, LiF/Ca, LiF/Al, Al, Ag, Mg, or a compound thereof. Further, an auxiliary electrode layer or a bus electrode layer may be further formed on the thin metal film as a material for forming a transparent electrode, such as ITO, IZO, ZnO and $In_2O_3$. Accordingly, the second electrode 113 may transmit the light emitted from the light-emitting diode 130.

Although the flip-chip light-emitting diode 130 in which the first electrode pad 135 and the second electrode pad 138 are disposed on the same side is shown in FIG. 6, the inventive concepts are not limited thereto. For example, the light-emitting diode 130 may be a vertical light-emitting diode 130 in which the first electrode pad 135 is disposed on the opposite side of the second electrode pad 138, as in the exemplary embodiment shown in FIG. 7.

Referring to FIG. 7, a first electrode pad 135 may be formed on a first semiconductor layer 131, and a second electrode pad 138 may be formed on a second semiconductor layer 132. The first electrode pad 135 may be attached to a first electrode 111. In addition, the second electrode pad 138 may be disposed on the opposite side of the first electrode pad 135, and a second electrode 113 may be disposed on the light-emitting layer 110 in contact with the second electrode pad 138.

The second electrode 113 may be formed on the entire surface of the light-emitting layer 110. The second electrode 113 may be a transparent or transflective electrode and may be formed as thin metal film having a small work function including Li, Ca, LiF/Ca, LiF/Al, Al, Ag, Mg, and a compound thereof. Further, an auxiliary electrode layer or a bus electrode may be further formed on the thin metal film as a material for forming a transparent electrode such as ITO, IZO, ZnO, and $In_2O_3$. Accordingly, the second electrode 113 may transmit the light emitted from the light-emitting emitting diode 130.

According to yet another exemplary embodiment shown in FIG. 8, a light-emitting unit LE may include an organic light-emitting diode OLED.

Specifically, an organic emissive layer 115 and a second electrode 113, which is a common electrode as the electron injection electrode, may be disposed on a first electrode 111 exposed by the pixel-defining layer 205 on the passivation layer 106. Holes and electrons are injected into the organic emissive layer 115, and the holes and the electrons combine in the organic emissive layer 115 to generate excitons. When the excitons relax from an excited state to the ground state, light can be emitted.

Hereinafter, a method of fabricating the above-described display device will be described.

FIGS. 9 to 13 are cross-sectional views for illustrating a method of fabricating an organic light-emitting diode display device according to an exemplary embodiment of the present invention. Like reference numerals similar to those used in FIG. 2 denote like elements, and redundant descriptions of such elements will not be repeated.

Figure 9:
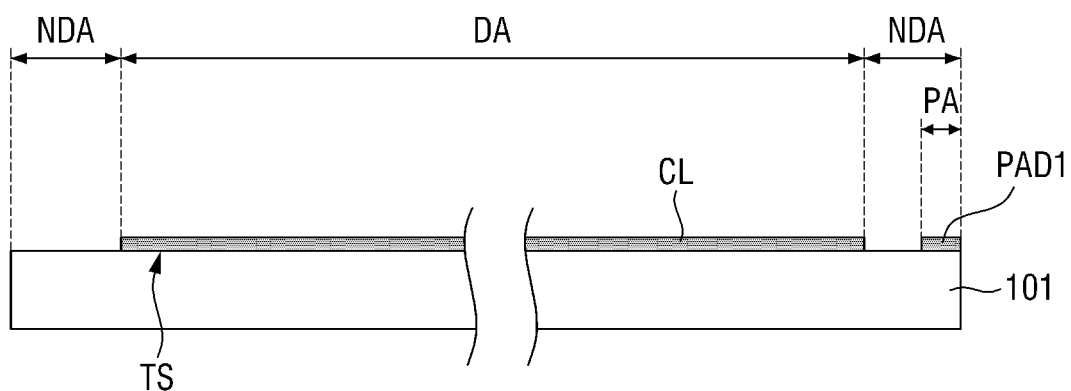
FIG. 9, FIG. 10, FIG. 11, FIG. 12, and FIG. 13 are cross-sectional views for illustrating a method of fabricating an organic light-emitting diode display device according to an exemplary embodiment of the present invention.

Referring to FIG. 9, a circuit layer CL is formed on the top surface TS of the substrate 101 in the display area DA, and a first pad unit PAD1 is formed on one side of the top surface TS of the substrate 101 in the non-display area NDA. The circuit layer CL may include gate lines, data lines and thin-film transistors TFT (see FIG. 2) each in the respective pixels P. An electrode for applying a voltage to the light-emitting unit LE may be formed at the top of the circuit layer CL. For example, when the light-emitting unit LE is implemented as a flip-chip light-emitting diode, the first electrode 111 (see FIG. 6) and the second electrode 113 (see FIG. 6) may be disposed. When the light-emitting unit LE is a vertical light-emitting diode or an organic light-emitting diode, the first electrode 111 (see FIGS. 7 and 8) may be disposed. It is, however, to be understood that the inventive concepts are not limited thereto. A variety of configurations are possible depending on the type of the light-emitting unit.

Figure 10:
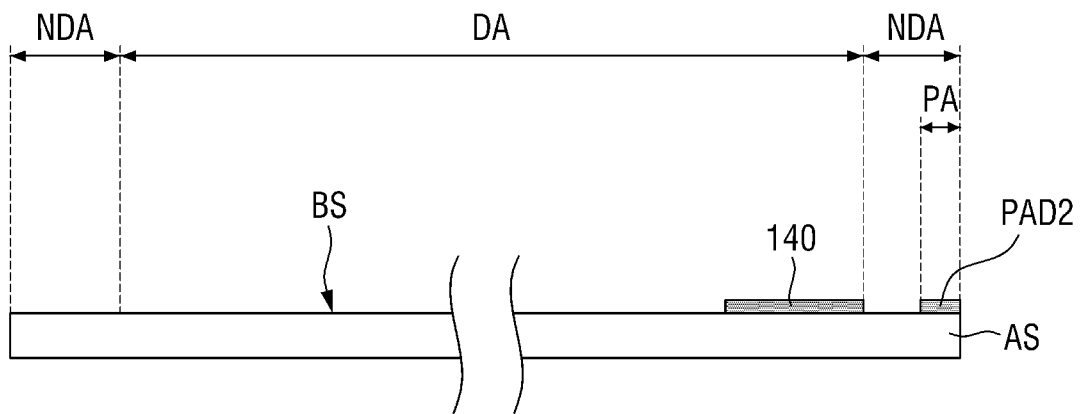

Referring to FIG. 10, a driving circuit 140 is formed on a part of the back surface BS of the auxiliary substrate AS in the display area DA. A second pad unit PAD2 is formed on one side of the back surface BS of the auxiliary substrate AS in the non-display area NDA. The driving circuit 140 may include a gate driver, a gate drive IC, a data driver, and a data drive IC.

As described above, the auxiliary substrate AS may have the same or a different size from the substrate 101, and the auxiliary substrate AS may be made of glass. It is, however, to be understood that the inventive concepts are not limited thereto. The auxiliary substrate 101 may be made of a flexible material.

Figure 11:
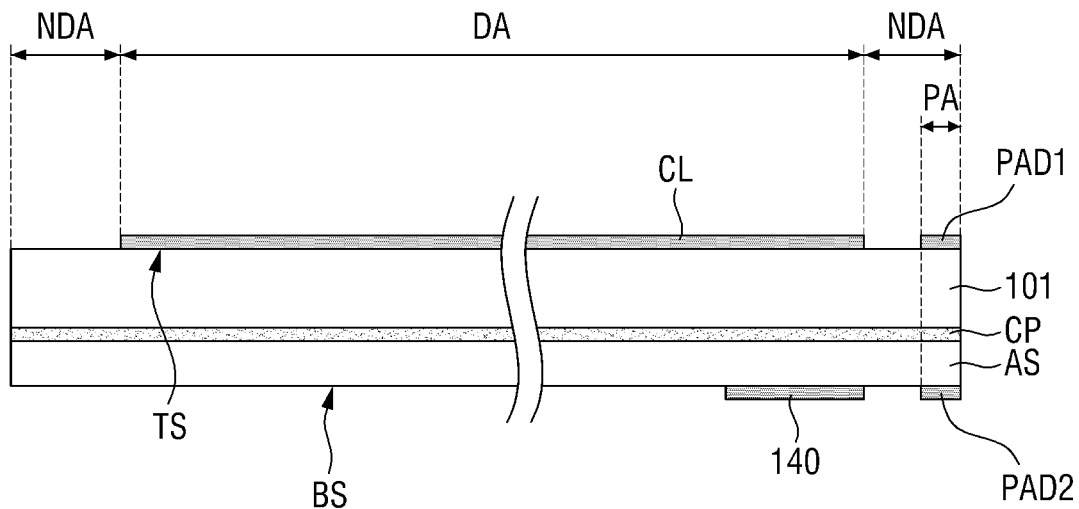

Referring to FIG. 11, the substrate 101 and the auxiliary substrate AS are attached together by using an adhesive member CP. That is to say, the opposite surface of the substrate 101 is attached to the opposite surface of the auxiliary substrate AS by using an adhesive member CP. The substrate 101 and the auxiliary substrate AS may be attached together such that the first pad unit PAD1 of the substrate 101 overlaps with the second pad unit PAD2 of the auxiliary substrate AS in the vertical direction. It is, however, to be understood that the inventive concepts are not limited thereto. The first pad unit PAD1 of the substrate 101 and the driving circuit 140 and the second pad unit PAD2 of the auxiliary substrate AS may be disposed in a variety of ways.

As described above, by forming the circuit layer CL on the substrate 101 and the driving circuit 140 on the auxiliary substrate AS and then attaching the substrate 101 and the auxiliary substrate AS together, it is possible to prevent the circuit layer CL already formed on the surface of the substrate 101 from being damaged during the process of forming the driving circuit 140 on the opposite surface of the substrate 101.

Figure 12:
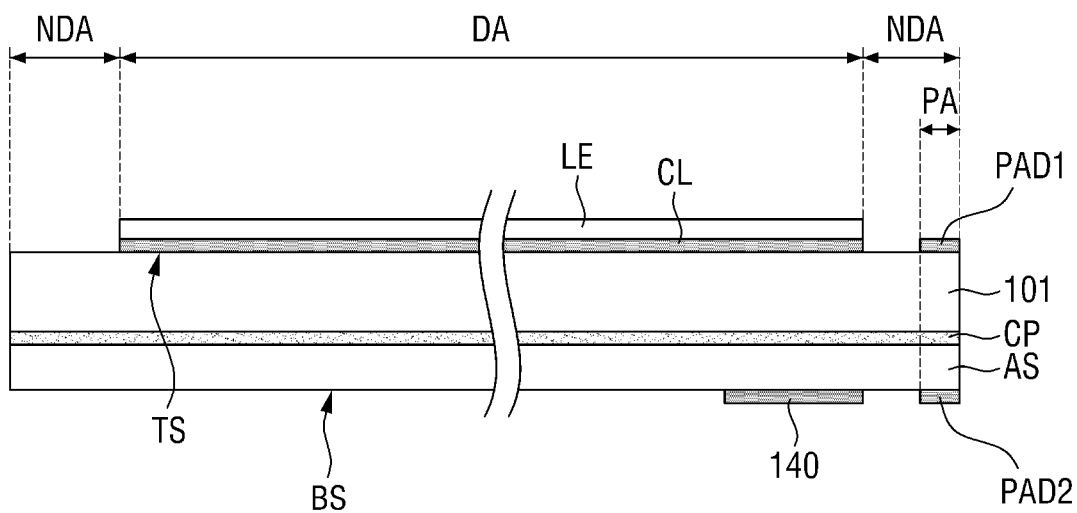
Figure 13:
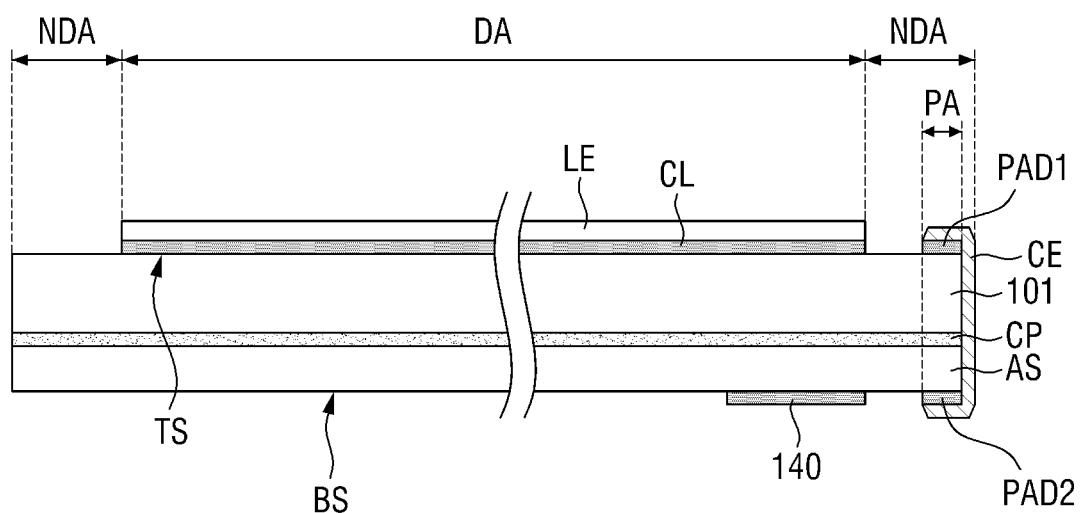

Referring to FIG. 12, a light-emitting unit LE is formed on the circuit layer CL in the display area DA. For example, when the light-emitting unit LE is implemented as the light-emitting diode 130 (see FIG. 6), the light-emitting diode 130 is formed on a separate base substrate, the light-emitting diode 130 is placed above a carrier substrate with spacing, and then it is picked up from the carrier substrate by a transfer device and transferred onto the circuit layer CL. When the light-emitting unit LE is the organic light-emitting diode OLED (see FIG. 4), the organic emissive layer 115 and the second electrode 113, which is a common electrode as the electron injection electrode, may be formed on the first electrode 111 (see FIG. 8) of the circuit layer Referring to FIG. 13, the first pad unit PAD1 of the substrate 101 is connected to the second pad unit PAD2 of the auxiliary substrate AS through the connection electrode CE. For example, the connection electrode CE may be disposed such that it covers the first pad unit PAD1, the side surfaces of the substrate 101 and the auxiliary substrate AS, and the second pad unit PAD2. The first pad unit PAD1 may be electrically connected to the second pad unit PAD2 through the connection electrode CE, so that the first pad unit PAD1 can receive signals for driving the display device 10 from the driving circuit 140. In addition, by connecting the first pad unit PAD1 with the second pad unit PAD2 through the connection electrode CE without flexible printed circuit boards, it is possible to effectively reduce the size of the non-display areas NDA of the tiled display device 1 in each of which the bezel of one of the display devices 10 and the bezel of the adjacent one are disposed (see FIG. 1).

Exemplary embodiments of the present invention provide a display device with reduced bezel and a method of fabricating the same.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of fabricating a display device, the method comprising:
   forming both a circuit layer and a first pad unit on a first surface of a substrate the substrate having a display area and a non-display area outside the display area;
   forming both a driving circuit and a second pad unit on a fourth surface of an auxiliary substrate; and
   attaching a second surface the substrate opposite the first surface to a third surface of the auxiliary substrate opposite the fourth surface, wherein a distal side surface connects the first surface to the second surface and a distal side surface connects the third surface to the fourth surface; and
   forming a connection electrode that electrically connects a pad of the first pad unit with a pad of the second pad unit, the connection electrode being in direct contact with both of the distal side surface of the substrate and the distal side surface of the auxiliary substrate, wherein
   the second pad unit is disposed in the non-display area between the auxiliary substrate and a portion of the connection electrode in a direction perpendicular to the first surface of a substrate.

2. The method of claim 1, further comprising forming a plurality of connection electrodes, each connection electrode electrically connecting a respective pad of both the first pad unit and the second pad unit and being in direct contact with both of the side surface of the substrate and the side surface of the auxiliary substrate.

3. The method of claim 2, further comprising forming a light-emitting unit on the circuit layer.

4. The method of claim 3, wherein the auxiliary substrate is made of a glass material.

5. The method of claim 4, wherein the light-emitting unit comprises a light-emitting diode.

6. The method of claim 5, wherein
   the light-emitting diode comprises a first semiconductor layer, a second semiconductor layer, and an intermediate layer between the first semiconductor layer and the second semiconductor layer; and
   a first electrode pad is formed on the first semiconductor layer and a second electrode pad is formed on the second semiconductor layer.

7. The method of claim 2, wherein each connection electrode of the plurality of connection electrodes electrically connects the first pad unit with the second pad unit.

8. A method of fabricating a display device, the method comprising:
   forming a circuit layer and a first pad unit on a first surface of a substrate the substrate having a display area and a non-display area outside the display area;
   forming a light-emitting unit on the circuit layer, wherein the light-emitting unit comprises a light-emitting diode;
   forming a driving circuit and a second pad unit on a fourth surface of an auxiliary substrate; and
   attaching a second surface the substrate opposite the first surface to a third surface of the auxiliary substrate opposite the fourth surface, wherein a distal side surface connects the first surface to the second surface and a distal side surface connects the third surface to the fourth surface; and
   forming a connection electrode that electrically connects a pad of the first pad unit with a pad of the second pad unit, the first connection electrode traversing across an entirety of both of the distal side surface of the substrate and the distal side surface of the auxiliary substrate as seen in side view, wherein
   the second pad unit is disposed in the non-display area between the auxiliary substrate and a portion of the connection electrode in a direction perpendicular to the first surface of a substrate.

9. The method of claim 8, wherein the connection electrode bends around an edge connecting the first surface and the side surface connecting the first surface to the second surface.

10. The method of claim 9, wherein the connection electrode also bends around an edge connecting the fourth surface and the side surface connecting the third surface to the fourth surface.

11. The method of claim 8, further comprising forming a plurality of connection electrodes, each connection electrode electrically connecting a respective pad of both the first pad unit and the second pad unit and traversing across an entirety of both of the side surface of the substrate and the side surface of the auxiliary substrate as seen in side view.

* * * * *